(12) United States Patent
Takahashi et al.

(10) Patent No.: US 7,109,538 B2
(45) Date of Patent: Sep. 19, 2006

(54) NONVOLATILE SEMICONDUCTOR MEMORY DEVICE

(75) Inventors: Shuichi Takahashi, Oizumi-machi (JP); Fumiko Shikakura, Oizumi-machi (JP); Shinya Mori, Gyoda (JP); Junji Yamada, Ojima-machi (JP); Yutaka Yamada, Ojima-machi (JP); Toshimitsu Taniguchi, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 273 days.

(21) Appl. No.: 10/696,580

(22) Filed: Oct. 30, 2003

(65) Prior Publication Data
US 2004/0135256 A1  Jul. 15, 2004

(30) Foreign Application Priority Data
Oct. 30, 2002  (JP) .............................. 2002-316483

(51) Int. Cl.
*H01L 29/76* (2006.01)
(52) U.S. Cl. ...................... 257/295; 257/306; 257/758
(58) Field of Classification Search ................. 257/295
See application file for complete search history.

(56) References Cited

U.S. PATENT DOCUMENTS 5,990,507 A * 11/1999 Mochizuki et al. ......... 257/295
6,229,186 B1   5/2001 Ishida
6,316,801 B1 * 11/2001 Amanuma ................... 257/306
6,423,584 B1 *  7/2002 Takahashi et al. .......... 438/152
6,537,877 B1 *  3/2003 Ishida ........................ 438/258
6,825,076 B1 * 11/2004 Okita ......................... 438/239

FOREIGN PATENT DOCUMENTS

JP   2000-31298   1/2000
JP   2002-230987  8/2002

* cited by examiner

*Primary Examiner*—Andy Huynh
*Assistant Examiner*—Dao H. Nguyen
(74) *Attorney, Agent, or Firm*—Morrison & Foerster LLP

(57) ABSTRACT

A nonvolatile semiconductor memory device includes a plurality of memory transistors, a plurality of insulating layers disposed over the transistors, and a plurality of metal layers. Each of the metal layers is disposed on one of the insulating layers. The device also includes a plurality of metal plugs disposed over corresponding memory transistors. Each of the metal plugs filling in a contact hole formed in one of the insulating layers and electrically connecting the metal layers disposed on a top side and a bottom side of the corresponding insulating layer. A top metal layer of the plurality of metal layers is configured to provide bit lines that correspond to the memory transistors, the metal plugs are vertically aligned, and one of the insulating layers is configured so that whether one of the memory transistors is connected to a corresponding bit line is determined by whether a metal plug corresponding to the memory transistor exists in the insulating layer.

8 Claims, 5 Drawing Sheets

NONVOLATILE SEMICONDUCTOR MEMORY DEVICE

BACKGROUND OF THE INVENTION

1. Field of the Invention

This invention relates to a nonvolatile semiconductor memory device, specifically to a nonvolatile semiconductor memory device to which a multi-layer metal process is applied.

2. Description of the Related Art

A Mask ROM (Read Only Memory) which is programmed by modifying a mask has been known as a nonvolatile semiconductor memory device. There are several programming methods for the Mask ROM including the following.

(1) Diffusion mask programming method in which a memory transistor is connected or disconnected to a bit line according to whether a diffusion layer is provided or not provided.

(2) Ion implantation mask programming method in which conduction of a memory transistor is altered according to whether ions are implanted or not implanted into a channel region of the memory transistor.

(3) Contact hole mask programming method in which a memory transistor is connected or disconnected to a bit line according to whether a contact hole is provided or not provided.

TAT (Turn Around Time) of a Mask ROM can be made shorter when a programming process step is closer to the final step in manufacturing the Mask ROM, since the programming process step is applied on the Mask ROM after receiving a purchase order from a customer in general. That is, a period of time from the receipt of the purchase order to delivery of the Mask ROM can be reduced.

Among the programming methods of the Mask ROM mentioned above, the diffusion mask programming method is least advantageous to reduce the TAT, because the diffusion process is in an early stage in the manufacturing process of the Mask ROM.

The ion implantation process can be performed at a later stage in manufacturing process of the Mask ROM, thus the TAT can be reduced with the ion implantation mask programming method. However, when the ion implantation mask programming method is adopted into the Mask ROM to which the multi-layer metal process is applied, implanting ions into channel regions of memory transistors requires implanting ions with acceleration energy high enough to penetrate stacked multi-layer insulating layers or implanting ions after etching the insulating layers to some extent so that ions can be implanted with relatively low acceleration energy, resulting in increased complexity of the manufacturing process.

SUMMARY OF THE INVENTION

The invention provides a nonvolatile semiconductor memory device that includes a plurality of memory transistors, a plurality of insulating layers disposed over the transistors, and a plurality of metal layers. Each of the metal layers is disposed on one of the insulating layers. The device also includes a plurality of metal plugs disposed over corresponding memory transistors. Each of the metal plugs filling in a contact hole formed in one of the insulating layers and electrically connecting the metal layers disposed on a top side and a bottom side of the corresponding insulating layer. A top metal layer of the plurality of metal layers is configured to provide bit lines that correspond to the memory transistors, the metal plugs are vertically aligned, and one of the insulating layers is configured so that whether one of the memory transistors is connected to a corresponding bit line is determined by whether a metal plug corresponding to the memory transistor exists in the insulating layer.

DETAILED DESCRIPTION OF THE INVENTION

Figure 1:
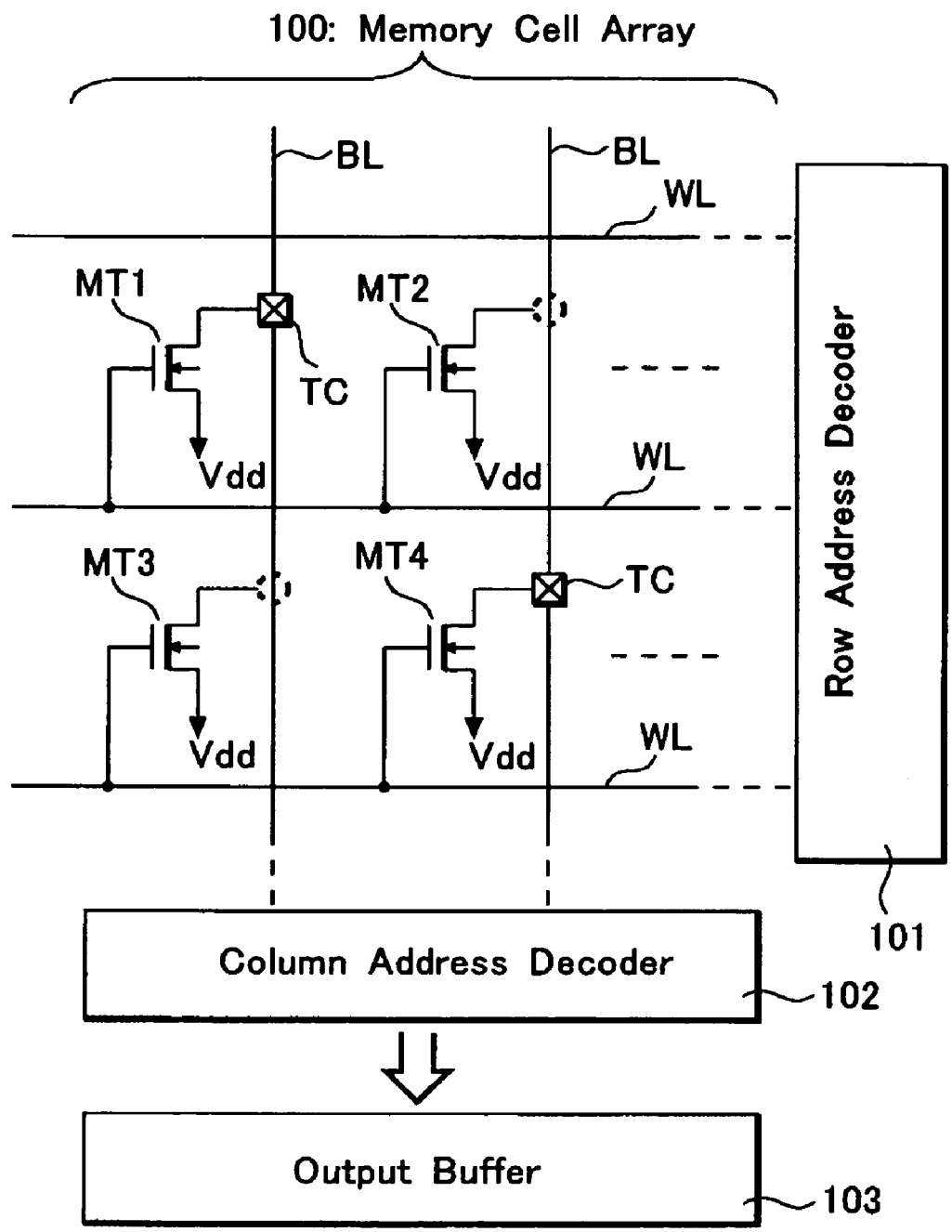
FIG. 1 is a circuit diagram of a Mask ROM according to an embodiment of this invention.
Figure 2:
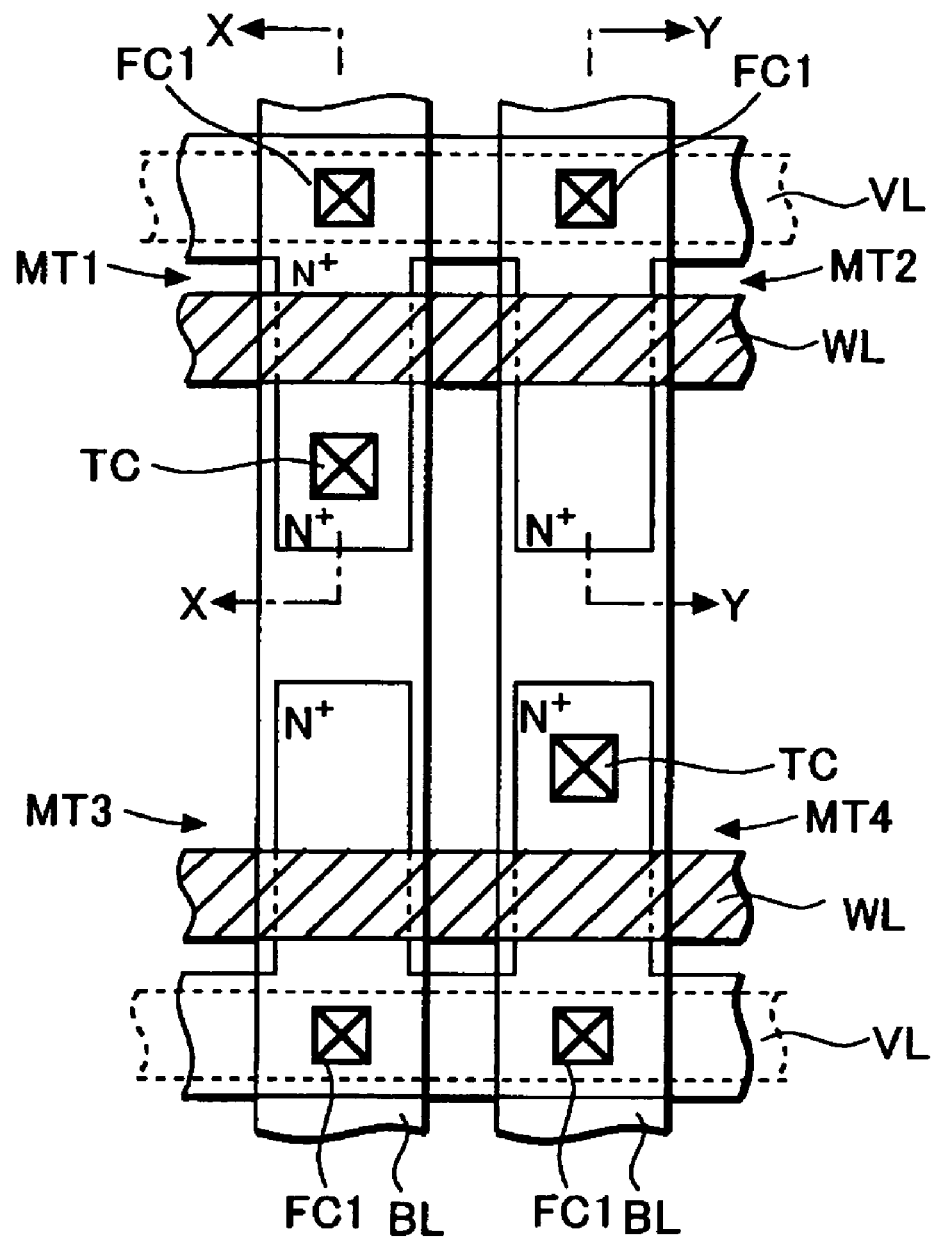
FIG. 2 is a layout of a memory cell array in the Mask ROM shown in FIG. 1.
Figure 3:
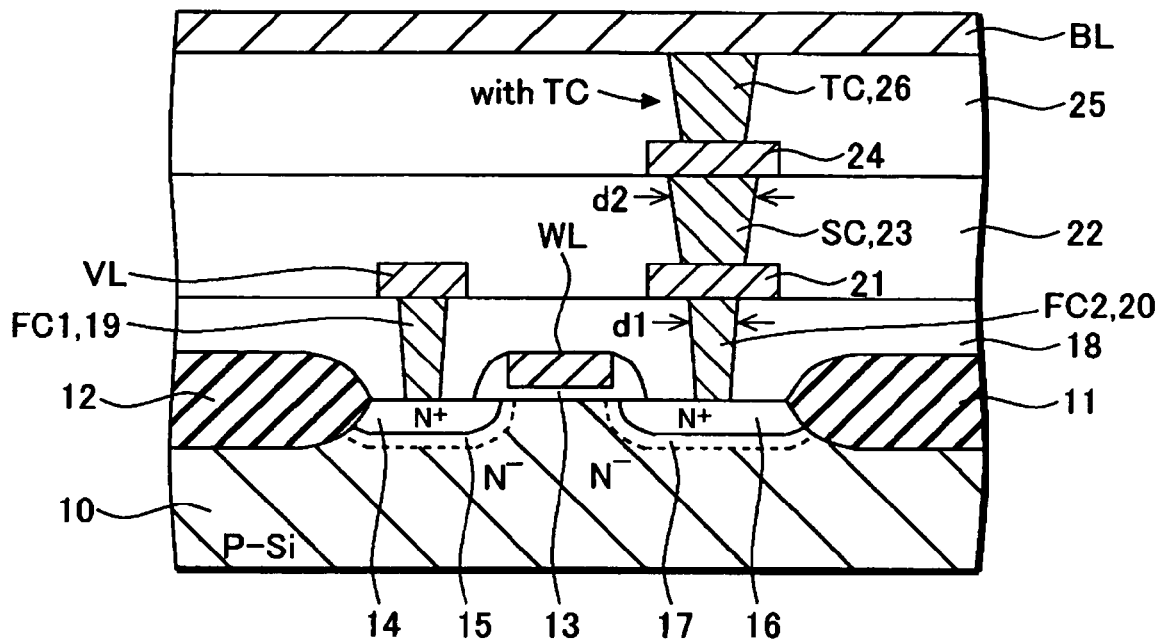
FIG. 3 is a cross-sectional view showing section X–X in FIG. 2.
Figure 4:
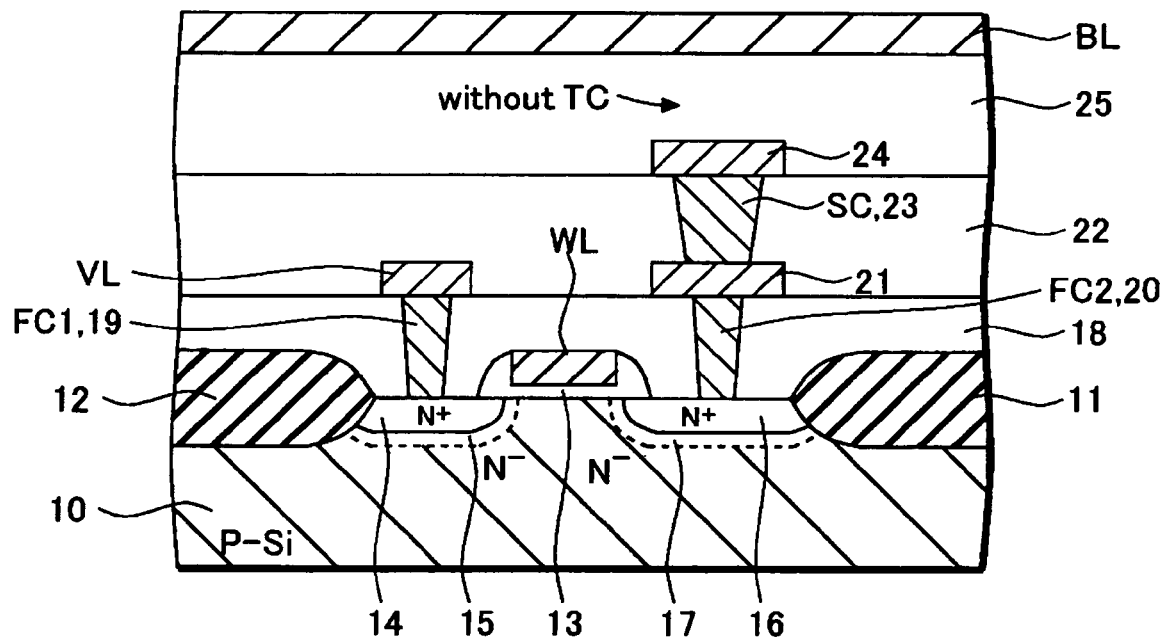
FIG. 4 is a cross-sectional view showing section Y–Y in FIG. 2.

Next, an embodiment of this invention will be described in detail referring to the figures. FIG. 1 is a circuit diagram of a Mask ROM. FIG. 2 is a layout of a memory cell array in the Mask ROM shown in FIG. 1. FIG. 3 is cross-sectional view showing a section X—X in FIG. 2. FIG. 4 is a cross-sectional view showing section Y—Y in FIG. 2.

The Mask ROM has a memory cell array 100, a row address decoder 101, a column address decoder 102 and an output buffer 103, as shown in FIG. 1. The Mask ROM may be an independent device or may be embedded in a microcomputer or in a logic LSI as a program memory. Many memory transistors are disposed in matrix form in the memory cell array 100.

Four memory transistors MT1, MT2, MT3 and MT4 in the memory cell array 100 are shown in FIG. 1 and in FIG. 2. Each of the memory transistors MT1, MT2, MT3 and MT4 is an N-channel type MOS transistor. Note that each of the memory transistors MT1, MT2, MT3 and MT4 may be a P-channel type MOS transistor.

A plurality of word lines WL is disposed in direction of rows. The word lines WL are connected to a row address decoder 101. The row address decoder 101 selects a word line WL out of the plurality of word lines WL according to row address data. Each of the word lines WL is made of a polysilicon layer or a polycide layer.

Also, a plurality of bit lines BL is disposed in direction of columns. The bit lines BL are connected to a column address decoder 102. The column address decoder 102 selects a bit line BL out of the plurality of bit lines BL according to column address data. Each of the bit lines BL is made of a third-layer metal. A couple of bit lines BL are disposed to cover the memory transistors MT1, MT2, MT3 and MT4.

Each of the memory transistors MT1, MT2, MT3 and MT4 is disposed in a region where one of the bit lines BL and one of the word lines WL intersect. A gate of each of the memory transistors MT1, MT2, MT3 and MT4 is formed as part of the corresponding word line WL. A source region of each of the memory transistors MT1, MT2, MT3 and MT4 is commonly connected to a power supply line VL which provides power supply voltage Vdd (or ground potential Vss) through each of first contact holes FC 1.

And whether a drain region of each of the memory transistors MT1, MT2, MT3 and MT4 is connected to the corresponding bit line BL is determined according to whether the memory transistor is provided with a third contact hole TC. For example, the memory transistor MT1 is connected to the corresponding bit line BL through a W plug 26 buried in a third contact hole TC, which will be described later, since the memory transistor MT1 is provided with the third contact hole TC. On the other hand, the memory transistor MT2 is not connected to the corresponding bit line BL, since the memory transistor MT2 is not provided with a third contact hole TC.

Similarly, the memory transistor MT3 is not connected to the corresponding bit line BL, since the memory transistor MT3 is not provided with a third contact hole TC. The memory transistor MT4 is connected to the corresponding bit line BL through a W plug 26 buried in a third contact hole TC, since the memory transistor MT4 is provided with the third contact hole TC.

Next, the memory transistor MT1 will be described more in detail, referring to a cross-sectional view shown in FIG. 3. Field oxide films 11 and 12 for isolation of transistors are formed on a semiconductor substrate 10 such as a Si substrate. A gate insulation film 13 is formed on the semiconductor substrate 10 between the field oxide films 111 and 12.

A word line WL, which also serves as a gate, is formed on the gate insulation film 13. A source region having an $N^+$-type layer 14 and an $N^-$-type layer 15 is formed in a surface of the semiconductor substrate 10 adjacent and on one side of the word line WL. Also, a drain region having an $N^+$-type layer 16 and an $N^-$-type layer 17 is formed in a surface of the semiconductor substrate 10 adjacent and on the other side of the word line WL. That is, the memory transistor MT1 has an LDD (Lightly Doped Drain) structure. Other memory transistors have the same structure also.

A first insulating layer 18 is formed on the memory transistor MT1 as an interlayer insulation film. A couple of first contact holes FC1 and FC2 are formed in the first insulating layer 18. The first contact hole FC1 is formed to expose the source region, and is filled with a W plug 19. A W plug means a body of tungsten (W) buried in a contact hole. Another W plug 20 is buried in another first contact hole FC2.

The power supply line VL is formed on the W plug 19, and is electrically connected with the source region of the memory transistor MT1 through the W plug 19. A first layer metal 21 is formed on the W plug 20. The first layer metal 21 is electrically connected with the drain region of the memory transistor MT1 through the W plug 20. The first layer metal 21 has a predetermined extension around the first contact hole FC2.

A second insulating layer 22 is formed on the power supply line VL and the first layer metal 21 as an interlayer insulation film. A second contact hole SC is formed in the second insulating layer 22. The second contact hole SC is formed to expose a surface of the first layer metal 21, and is filled with a W plug 23.

A second layer metal 24 is formed on the W plug 23. The second layer metal 24 is electrically connected with the underlying first layer metal 21 through the W plug 23. The second layer metal 24 has a predetermined extension around the second contact hole SC. And a third insulating layer 25 is formed on the second layer metal 24 as an interlayer insulation film.

A third contact hole TC may be formed in the third insulating layer 25. Whether the memory transistors MT1 is connected to the bit line BL made of the third layer metal is determined according to whether the memory transistor MT1 is provided with the third contact hole TC. In this case, the memory transistor MT1 is provided with the third contact hole TC. That is, the third contact hole TC is formed to expose a surface of the second layer metal 24, and is filled with a W plug 26. The bit line BL is formed on the W plug 26. Therefore, the drain region of the memory transistor MT1 is electrically connected to the bit line BL through the W plug 20, the W plug 23 and the W plug 26.

In the structure described above, the first contact hole FC2, the second contact hole SC, the third contact hole TC and W plugs 20, 23 and 26, each of which is buried in each of the respective contact holes, are aligned vertically. The structure in which the contact holes are stacked as described above is referred to as a stacked contact structure. The patterning area taken up by contact hole regions in a multi-layer metal structure is minimized by using this stacked contact structure.

And it is preferable that size of each of the second contact hole SC and the third contact hole TC is larger than a size of the first contact hole FC2 in the stacked contact hole structure. Hereby, contact resistance of the multi-layer metal structure can be minimized, and thus speed of the Mask ROM can be enhanced.

Also a size of the memory transistor MT1 can be reduced by reducing the size of the first contact hole FC2. The size of the contact hole is defined as a size of an opening of the contact hole. Since a contact hole is formed by dry etching in general, the size of the opening at the top portion of the contact hole is larger than the size of the opening at the bottom portion of the contact hole. The size of the contact hole is compared in terms of the size at the top portion or the size at the bottom portion. For example, when the size of the first contact hole FC2 at the top portion is d1 while the size of the second contact hole SC at the top portion is d2, d2 is larger than d1.

Next, the memory transistor MT2 will be described more in detail, referring to a cross-sectional view shown in FIG. 4. A third contact hole TC corresponding to the third contact hole TC in FIG. 3 is not provided to the memory transistor MT2. As a result, the memory transistor MT2 is not connected to the corresponding bit line BL. Rest of the structure of the memory transistor MT2 is the same as that of the memory transistor MT1 shown in FIG. 3.

Also, the memory transistor MT3, to which a third contact hole TC is not provide, has the same structure as the memory transistor MT2, while the memory transistor MT4, to which a third contact hole TC is provided, has the same structure as the memory transistor MT1. As a matter of course, whether one of the memory transistors is provided with a third contact hole TC is arbitrary and is to be decided accordingly to a program to be written into the Mask ROM.

Next, operation of the Mask ROM described above will be explained. It is assumed that the memory transistor MT1 is selected by the row address decoder 101 and the column address decoder 102, for example. The word line WL connected to the memory transistor MT1 is turned to a high level while the bit line BL connected to the memory transistor MT1 is selected, in this case. Also it is assumed that the bit line BL is pre-charged to a predetermined pre-charge electric potential before the memory transistor MT1 is selected.

Then the memory transistor MT1 is turned on. Since the drain region of the memory transistor MT1 is connected to the bit line BL through the third contact hole TC, the power supply voltage Vdd is outputted to the bit line BL through the memory transistor MT1. As a result, an electric potential of the bit line BL is turned from the pre-charge electric potential to Vdd. A memory status of the memory transistor MT1 in this situation is defined as "1". A programmed data "1" is outputted from the bit line BL to outside of the Mask ROM through the output buffer 103.

Now, it is assumed that the memory transistor MT2 is selected by the row address decoder 101 and the column address decoder 102. In this case, the word line WL connected to the memory transistor MT2 is turned to the high level while the bit line BL connected to the memory transistor MT2 is selected. However, the memory transistor MT2 is not connected to the bit line BL in this case, since the memory transistor MT2 is not provided with the third contact hole TC. As a result, electric potential of the bit line BL remains at the pre-charge electric potential. A memory status of the memory transistor MT2 in this situation is defined as "0". A programmed data "0" is outputted from the bit line BL to outside of the Mask ROM through the output buffer 103.

It is made possible that the programmed data of either "1" or "0" is written into and read out from a memory transistor at each of the addresses of the Mask ROM based on whether the third contact hole TC is provided or not provided to the memory transistor.

In the embodiment described above, it is made possible that the programmed data is written into and read out from each of the memory transistors, based on whether the third contact hole TC is provided to the memory transistor. Hereby, the TAT of the Mask ROM is shortened. In other words, a period of time from the receipt of the purchase order from a customer to delivery of the Mask ROM can be reduced to a minimum.

Figure 5:
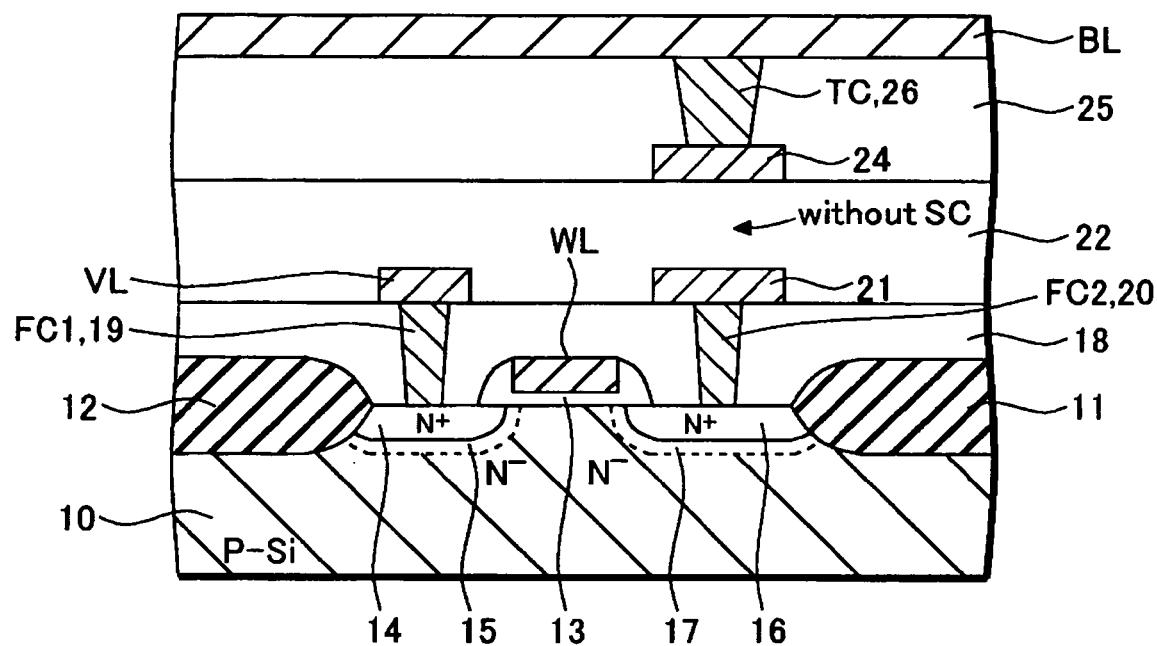
FIG. 5 is a cross-sectional view showing a section Y–Y in FIG. 2 for a Mask ROM as a modification of the device of FIG. 1.

This invention is not limited to the case mentioned above, but also can be applied to a case in which lower layer contact holes are used for programming instead of the third contact holes TC. For example, it is also possible that the programmed data is written into and read out from each of the memory transistors, based on whether the second contact hole SC is provided or not provided to the memory transistor. FIG. 5 is a cross-sectional view showing a memory transistor to which the second contact hole SC is not provided in the second contact hole programming method mentioned above. The cross-sectional view in FIG. 5 corresponds to the cross-sectional view in FIG. 4. In this case, the TAT becomes longer compared with the third contact hole programming method. It is because forming the second contact hole is made earlier in the manufacturing process than forming the third contact hole.

However, the second contact hole programming method has an advantage in security that the programmed data is not readable optically. That is, it is not possible to detect optically whether the second contact hole is formed or not, because every memory transistor is provided with the third contact hole TC filled with the W plug which conceals the underlying second contact hole with this programming method (Refer to FIG. 5). Having the stacked contact structure is a prerequisite for the situation mentioned above.

Next, a manufacturing method of the stacked contact structure will be explained referring to FIG. 6A through FIG. 6E. The explanation is given for forming the second contact hole SC and the W plug 23 in FIG. 3 as an example.

Figure 6A:
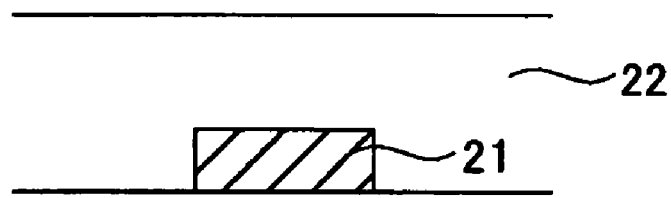
FIGS. 6A–6E are cross-sectional views showing processing steps to form a stacked contact structure.

The second insulating layer 22 is formed on the first layer metal 21, as shown in FIG. 6A. The second insulating layer 22 generally includes a plurality of stacked insulating layers for better flatness and to prevent cracks. Those layers include a TEOS (Tetraethoxy Silane) film, an SOG (Spin on Glass) film and a TEOS film by CVD (Chemical Vapor Deposition) method, for example. So-called CMP (Chemical Mechanical Polishing) method may be used to improve flatness of the second insulating layer 22. Thickness of the second insulating layer 22 is 800 nm, for example.

Figure 6B:
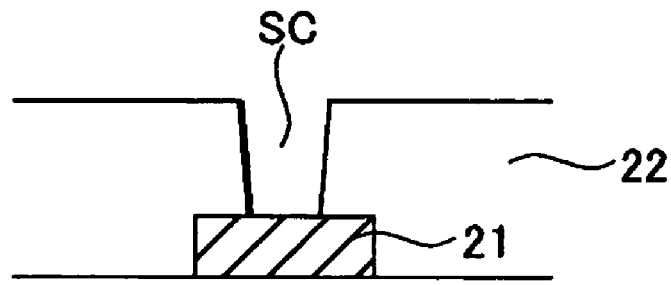
Figure 6C:
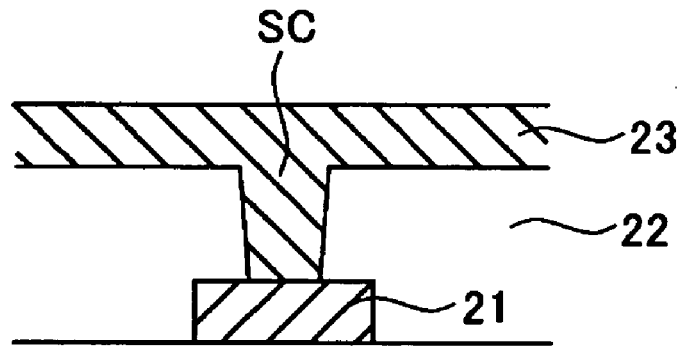

Next, the second contact hole SC is formed in the second insulating layer 22 by dry etching method to expose the surface of the first layer metal 21, as shown in FIG. 6B. Then as shown in FIG. 6C, tungsten W is deposited on the entire surface by CVD method. The second contact hole SC is filled with the tungsten W in the process.

Figure 6D:
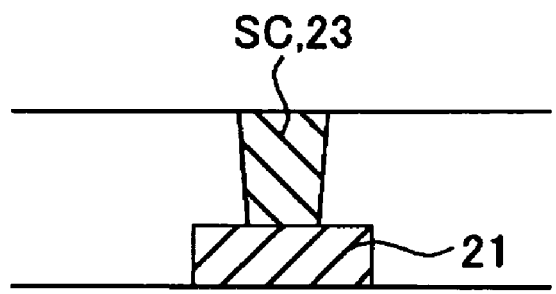
Figure 6E:
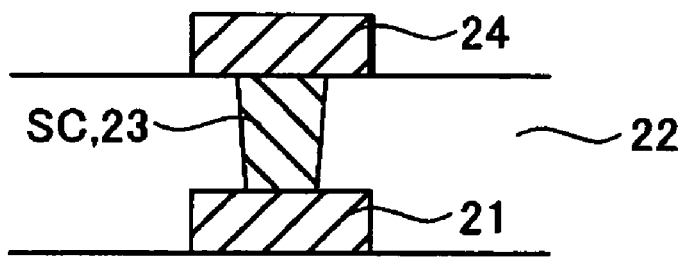

Then the tungsten W is etched back so that the tungsten W is left only in the second contact hole SC to form the W plug 23, as shown in FIG. 6D. An etching gas used in the process is $SF_6+Ar$, for example. After that, the second layer metal 24 is formed on the W plug 23, as shown in FIG. 6E. Note that the third insulating layer 23, the third contact hole TC and the W plug 26 may be formed in precisely the same way as described above.

Not limited to the manufacturing method described above, in which the W plug 23 is formed by etching back the tungsten W deposited on the entire surface, the W plug 23 may also be formed by selectively growing the tungsten W by so-called selective CVD method on the surface of the first layer metal 21 exposed by forming the second contact hole SC.

Although the explanation is made on the embodiment in which a three-layer metal process is applied to the Mask ROM, this invention is not limited to the embodiment but also applicable to a Mask ROM to which a two-layer metal process or four or more-layer metal process is applied.

This invention offers a Mask ROM to which the multi-layer metal process is applied and is programmed by selecting locations of contact holes in an insulating layer, which connect memory transistors to bit lines. In this structure, contact holes, each of which is formed in each of insulating layers, and metal plugs, each of which is buried in each of the contact holes, are vertically aligned, that is, having a stacked contact structure. Thus, the TAT of the Mask ROM is shortened, and the speed and integration of the Mask ROM are enhanced.

What is claimed is:

1. A nonvolatile semiconductor memory device comprising:
   a plurality of memory transistors;
   a plurality of insulating layers disposed over the transistors;
   a plurality of metal layers, each of the metal layers being disposed on one of the insulating layers; and
   a plurality of metal plugs disposed over corresponding memory transistors, each of the metal plugs filling in a contact hole formed in a corresponding insulating layer and electrically connecting the metal layers disposed on a top side and a bottom side of the corresponding insulating layer,
   wherein a top metal layer of the plurality of metal layers is configured to provide bit lines that correspond to the memory transistors, the metal plugs are vertically aligned, and one of the insulating layers is configured so that some but not all of the memory transistors are connected with corresponding bit lines by corresponding metal plugs of the one of the insulating layers.

2. The nonvolatile semiconductor memory device of claim 1, wherein the insulating layer configured for memory transistor connection is a top insulating layer of the plurality of the insulating layers.

3. The nonvolatile semiconductor memory device of claim 2, wherein a size of the metal plugs filling in the contact holes in the top insulating layer is larger than a size of the metal plugs filling in the contact holes in an insulating layer of the plurality of insulating layers that is not the top insulating layer.

4. The nonvolatile semiconductor memory device of claim 1, wherein a size of the metal plugs filling in the contact holes in a top insulating layer of the plurality of insulating layers is larger than a size of the metal plugs filling in the contact holes in an insulating layer of the plurality of insulating layers that is not the top insulating layer.

5. A nonvolatile semiconductor memory device comprising:
- a plurality of memory transistors;
- a first insulating layer disposed on the memory transistors;
- a plurality of first metal plugs filling in contact holes formed in the first insulating layer, each of the memory transistors being connected with one of the first metal plugs;
- a first metal layer disposed on the first metal plugs;
- a second insulating layer disposed on the first metal layer;
- a plurality of second metal plugs filling in contact holes formed in the second insulating layer, each of the first metal plugs being connected with one of the second metal plugs through the first metal layer;
- a second metal layer disposed on the second metal plugs;
- a third insulating layer disposed on the second metal layer; and
- a third metal layer disposed on the third insulating layer and providing bit lines,
- wherein a plurality of third metal plugs filling in contact holes formed in the third insulating layer are arranged so that some but not all of the memory transistors are connected with corresponding bit lines by the third metal plugs, and the first metal plugs, the second metal plugs, the third metal plugs and the memory transistors are vertically aligned for the memory transistors that have corresponding third metal plugs.

6. The nonvolatile semiconductor memory device of claim 5, wherein a size of the second metal plugs and a size of the third metal plugs are larger than a size of the first metal plugs.

7. A nonvolatile semiconductor memory device comprising:
- a plurality of memory transistors;
- a first insulating layer disposed on the memory transistors;
- a plurality of first metal plugs filling in contact holes formed in the first insulating layer, each of the memory transistors being connected with one of the first metal plugs;
- a first metal layer disposed on the first metal plugs;
- a second insulating layer disposed on the first metal layer;
- a second metal layer disposed on the second insulating layer;
- a third insulating layer disposed on the second metal layer;
- a plurality of third metal plugs filling in contact holes formed in the third insulating layer, each of the third metal plugs being disposed on one of the memory transistors; and
- a third metal layer disposed on the third metal plugs and providing bit lines,
- wherein a plurality of second metal plugs filling in contact holes formed in the second insulating layer are arranged so that some but not all of the memory transistors are connected with corresponding bit lines by the second metal plugs, and the first metal plugs, the second metal plugs, the third metal plugs and the memory transistors are vertically aligned for the memory transistors that have corresponding second metal plugs.

8. The nonvolatile semiconductor memory device of claim 7, wherein a size of the second metal plugs and a size of the third metal plugs are larger than a size of the first metal plugs.

* * * * *